US007652566B2

(12) United States Patent
Lee et al.

(10) Patent No.: US 7,652,566 B2
(45) Date of Patent: Jan. 26, 2010

(54) ARC WAVE GENERATOR FOR TESTING AN ARC-FAULT CIRCUIT INTERRUPTER

(75) Inventors: Jun Bae Lee, Seoul (KR); Shin Yon Jo, Incheon (KR)

(73) Assignee: Hetko, Inc., Seoul (KR)

( * ) Notice: Subject to any disclaimer, the term of this patent is extended or adjusted under 35 U.S.C. 154(b) by 303 days.

(21) Appl. No.: 11/905,508

(22) Filed: Oct. 1, 2007

(65) Prior Publication Data

US 2008/0284450 A1 Nov. 20, 2008

(51) Int. Cl.
*G08B 29/00* (2006.01)
*G08B 21/00* (2006.01)
*H02H 3/00* (2006.01)
*G01R 31/08* (2006.01)

(52) U.S. Cl. ...................... 340/515; 340/514; 340/638; 340/650; 340/659; 324/509; 324/527; 324/536; 324/537; 324/555; 361/42

(58) Field of Classification Search ................. 340/515
See application file for complete search history.

(56) References Cited

U.S. PATENT DOCUMENTS 6,466,029 B2 * 10/2002 Stroth et al. ................ 324/509
2002/0063565 A1 * 5/2002 Stroth ........................ 324/536
2004/0100274 A1 * 5/2004 Gloster et al. ............... 324/536
2005/0212522 A1 * 9/2005 Finlay et al. ................ 324/509

* cited by examiner

*Primary Examiner*—Donnie L Crosland
(74) *Attorney, Agent, or Firm*—Berenato & White, LLC

(57) ABSTRACT

Apparatus includes an arc wave generator for testing an arc fault circuit interrupter (AFCI) for use in a test system for testing whether or not an arc fault circuit interrupter (AFCI) is operating normally, in which a false arc is generated for use in testing the arc fault circuit interrupter (AFCI). The arc wave generator includes a rectifier which receives a commercial power source as an input source and rectifies alternating-current voltage of the commercial power source to generate a rectified signal. A drop resistor drops the voltage of the rectified signal to generate a voltage-dropped signal. A monostable multivibrator adjusts a voltage level and a pulse width of the voltage-dropped signal and generates a pulse signal which is used to generate a false arc for testing the arc fault circuit interrupter (AFCI). Thus, a false arc is generated with a simple circuit to accurately test the actions of the arc fault circuit interrupter (AFCI).

17 Claims, 6 Drawing Sheets

10
20
R1
C
AFCI INPUT
D1
D2
Vac
D3
D4
ZD
R2

6.0V
4.0V
2.0V
0V
-2.0V
0s
5ms
10ms
15ms
20ms
25ms
30ms
Time

AFCI INPUT
R5
50
Q2
R6
Q1
R7
R4
R2
20
ZD
C
R1
D2
D4
10
D1
D3
Vdc
Vac
V2
30

ARC WAVE GENERATOR FOR TESTING AN ARC-FAULT CIRCUIT INTERRUPTER

CROSS-REFERENCE TO RELATED APPLICATIONS AND CLAIM TO PRIORITY

This application is related to application number 2007-46544, filed May 14, 2007 in the Republic of Korea, the disclosure of which is incorporated herein by reference and to which priority is claimed.

FIELD OF THE INVENTION

The present invention relates to a test system which tests whether or not an arc fault circuit interrupter (AFCI) is operating normally, and more particularly, to an arc wave generator for testing an arc fault circuit interrupter (AFCI) by generating a pulse of a waveform similar to an actual arc pulse for use in testing the arc fault circuit interrupter (AFCI).

BACKGROUND OF THE INVENTION

Conventional earth leakage breakers are used as a component of an electric power distribution system, to prevent fire due to over-current, over-voltage or overload of electricity, in which an over-current, over-voltage or overload state of electricity is detected. However, recent studies have reported that most electrical fires are not caused by occurrence of an electric current leakage or overload, but are actually caused by occurrence of an arc. Since 2002 in the U.S.A., an arc fault circuit interrupter (AFCI) has been required under many building codes.

An arc fault circuit interrupter (AFCI) generally includes a mechanical unit, a sensor unit, and an electronic circuit unit. An arc generator is needed to test the electronic circuit unit among these components. Conventionally, a mechanical arc generator which generates arc by mechanical and electrical contact of blades or electric rods is usually used. Here, the generated arc wave is not a general sinusoidal wave but is of various wave forms according to various arcs.

That is, an arc is generated using an electric spark that occurs due to mechanical and electrical contact of the blades or electric rods. The generated arc is applied as an input of an arc detection circuit which is provided inside of the arc fault circuit interrupter (AFCI) to thereby test the AFCI's operational state.

However, the conventional mechanical arc generator has difficulty in performing correct simulation because the arc wave is irregularly generated and thus the AFCI's test condition is changed every time. Thus, there is a need for an improved arc wave generator for testing AFCIs.

SUMMARY OF THE INVENTION

The present invention generally relates to an arc wave generator that multiplies a sine wave and a square wave to generate an arc wave, and the generated arc wave is applied as the input of an arc detection circuit which is provided inside of an arc fault circuit interrupter (AFCI) to thereby test the arc fault circuit interrupt (AFCI). That is, the square wave is applied to the sine wave using a wave generator, in order to multiply both the square wave and the sine wave to generate an arc, and to change the magnitude and frequency of the generated arc signal. Then, the magnitude and frequency changed arc signal is input to an arc detection circuit of an arc fault circuit interrupter (AFCI) to thereby test the arc fault circuit interrupter (AFCI).

The present invention provides an arc wave generator for testing an arc fault circuit interrupter (AFCI) in which a false arc wave which is similar to an arc wave that generates an actual arc is generated to accurately test the AFCI's actions through a relatively simple circuit configuration.

An arc wave generator for use in a test system for testing whether or not an arc fault circuit interrupter (AFCI) is operating correctly includes a rectifier which rectifies alternating-current voltage of a commercial power source to generate a rectified signal. A drop resistor drops the voltage of the rectified signal to generate a voltage-dropped signal. A monostable multivibrator then adjusts a voltage level and a pulse width of the voltage-dropped signal and generates a pulse signal used to generate a false arc which is then input to the arc fault circuit interrupter (AFCI).

An arc fault circuit interrupter (AFCI) having circuitry for detecting an arcing condition and for interrupting operation of a circuit when the arcing condition is detected is also provided. The AFCI includes a testing circuit for generating a false arcing condition. The testing circuit includes a sinusoidal wave processing unit for receiving a sinusoidal AC power signal and processing said power signal to approximate a predetermined arc wave form, a square wave generator for generating a square wave of a predetermined frequency, and a multiplication unit for multiplying the square wave by the processed power signal to produce a false arc pulse.

A method of generating an arc wave for use in a test system for testing whether or not an arc fault circuit interrupter (AFCI) is operating normally is also provided. The method includes the steps of receiving an alternating-current voltage and rectifying the alternating current voltage to form a half-wave signal having a plurality of pulses. A voltage level and a pulse width of the pulses of the half-wave signal are then adjusted, and a false arc signal is generated based on the adjusted half-wave signal and provided the false arc signal to the AFCI for testing.

BRIEF DESCRIPTION OF DRAWINGS

The above and other objects and advantages of the present invention will become more apparent by describing the embodiments thereof in more detail with reference to the accompanying drawings in which.

DETAILED DESCRIPTION OF THE INVENTION

Figure 1:
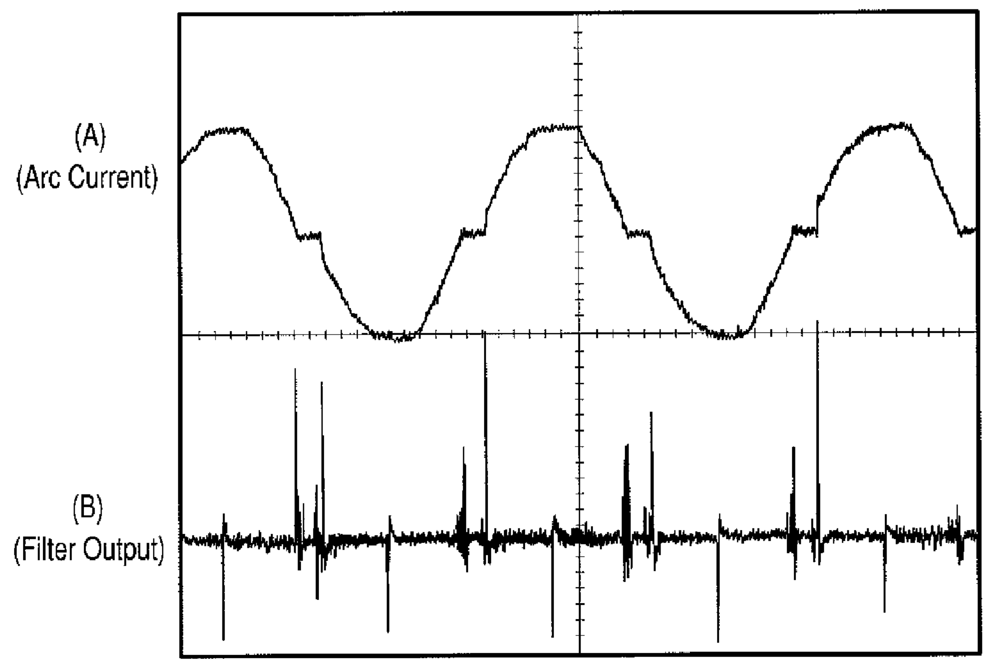
FIG. 1 illustrates waveform diagrams of an actual arc current as a waveform "A" and a filter output of an arc fault circuit interrupter (AFCI) as a waveform "B"

Hereinafter, an arc wave generator for testing an arc fault circuit interrupter (AFCI) according to embodiments of the present invention will be described with reference to the accompanying drawings. In the description, like reference numerals denote like elements.

An arc wave will be described below before explanation of the present invention. In FIG. 1, waveform "A" illustrates an actual arc current waveform, and waveform "B" illustrates an output of a filter in an arc fault circuit interrupter (AFCI) in which the filter filters only an arc at the time of inflow of the arc current of the waveform "A."

Figure 2:
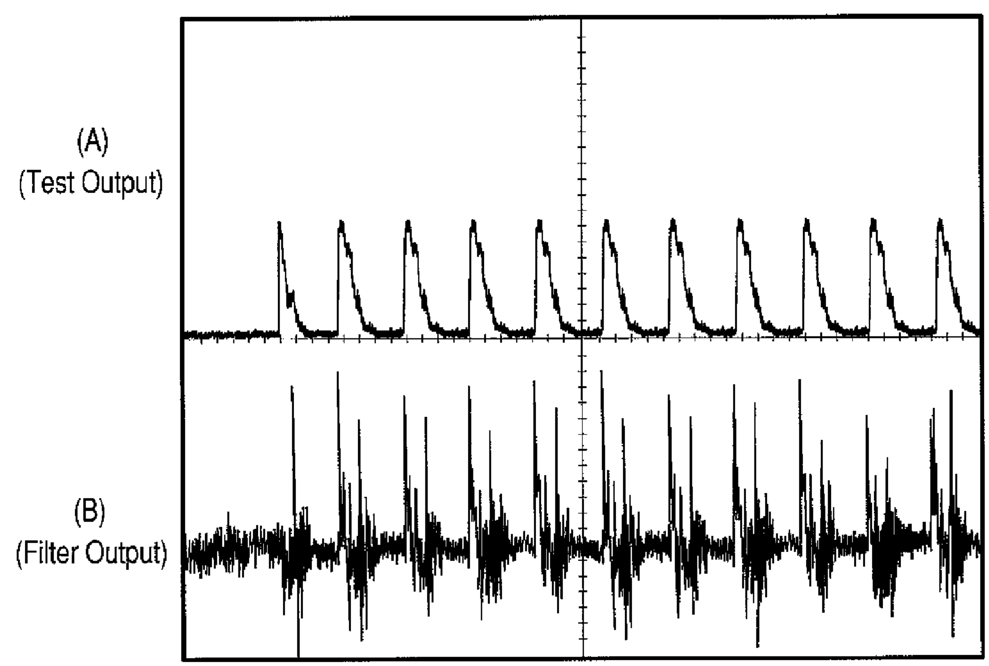
FIG. 2 illustrates waveform diagrams of a test output as a waveform "A" and a filter output of an arc fault circuit interrupter (AFCI) as a waveform "B"

In order to generate an arc signal randomly as shown as the waveform "B" of FIG. 1 for testing an arc fault circuit interrupter (AFCI), a test signal is needed as shown as waveform "A" of FIG. 2 resulting from a simulation. That is, if the test signal of the waveform "A" of FIG. 2 is applied as the input of the arc fault circuit interrupter (AFCI) and is filtered by the filter, a false arc shown as waveform "B" of FIG. 2 which is similar to the actual arc of the waveform "B" of FIG. 1 is generated.

The present invention provides an arc wave generator that generates a test signal of the waveform "A" of FIG. 2 for generating a false arc as shown as the waveform "B" of FIG. 2.

Figure 3:
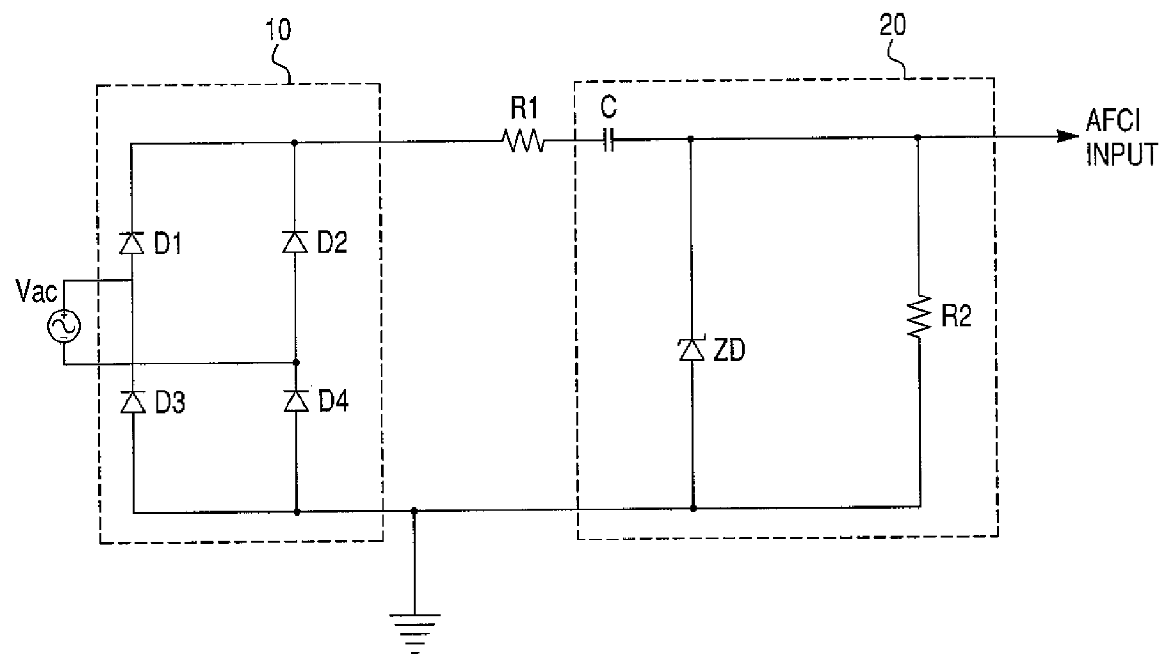
FIG. 3 is a circuit diagram of an arc wave generator for testing an arc fault circuit interrupter (AFCI) according to an exemplary embodiment of the present invention.

FIG. 3 is a circuit diagram illustrating an arc wave generator for testing an arc fault circuit interrupter (AFCI) according to an exemplary embodiment of the present invention. The arc wave generator shown in FIG. 3 includes a rectifier 10 which receives a commercial power source as an input source and rectifies alternating-current voltage Vac of the commercial power source. A voltage drop resistor R1 drops the voltage of the rectified signal. A mono-stable multivibrator 20 adjusts a voltage level and a pulse width of the voltage-dropped signal and generates a pulse signal which generates a false arc. The mono-stable multivibrator 20 includes a Zener diode (ZD) that determines a voltage level of the pulse signal, and a resistor R2 and a capacitor C that change a pulse width of the pulse signal based on a time constant of the resistor R2 and the capacitor C.

Figure 7:
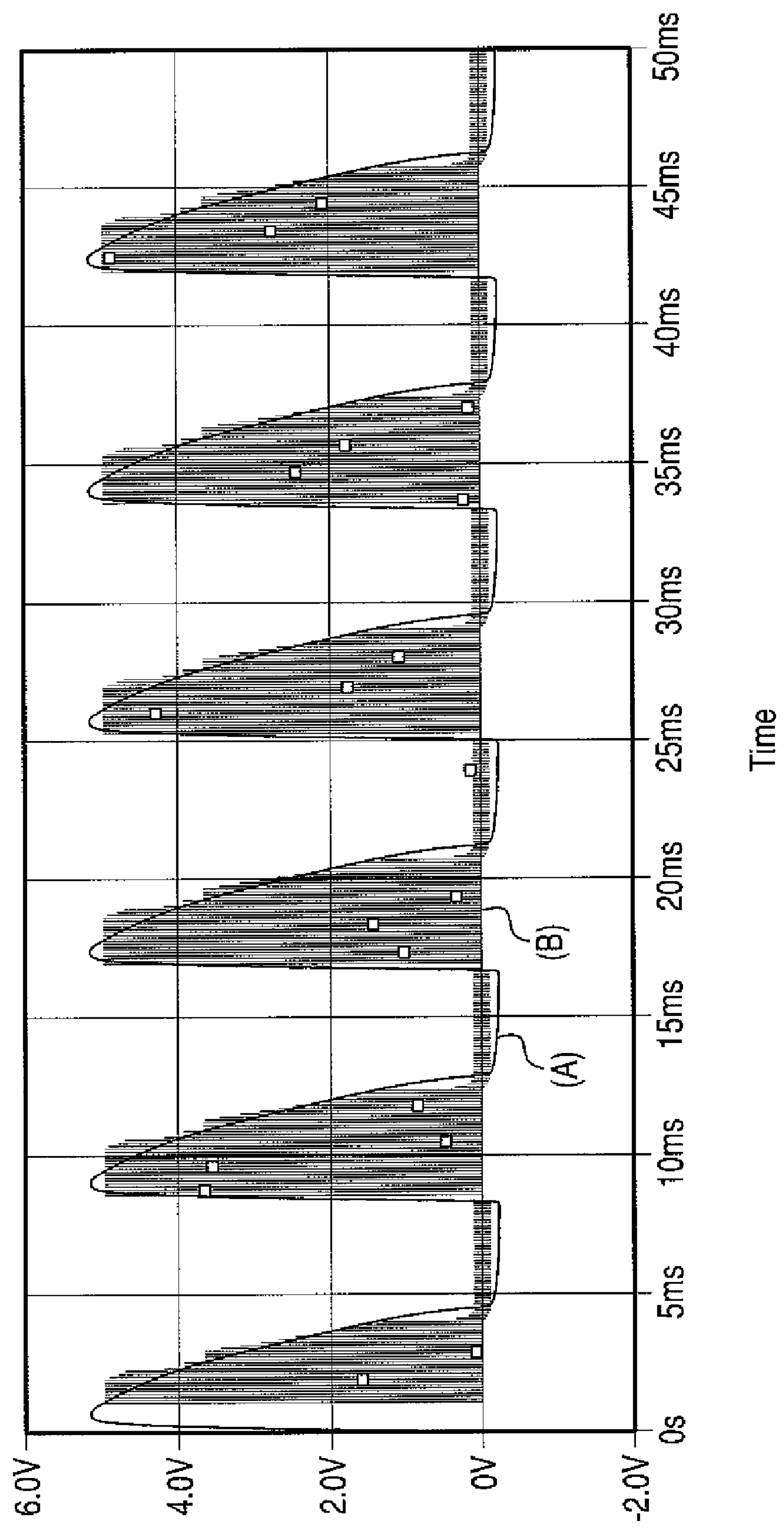
FIG. 7 is a waveform diagram of the arc wave generator of FIG. 6.

In FIG. 3, the rectifier 10 receives a commercial power source of 120V or 210V as an input and rectifies alternating-current voltage Vac of the commercial power source. Here, since the alternating-current voltage Vac of the commercial power source is a sinusoidal wave, the rectified wave in the rectifier 10 becomes a half-wave pulse which repeats with a phase interval of 180 degrees. The rectifier 10 is designed as a bridge circuit where four diodes D1, D2, D3 and D4 are connected in the form of a bridge, but is not limited hereto. The half-wave rectified signal from the rectifier 10 is voltage-dropped according to a resistance value of the drop resistor R1. The mono-stable multivibrator 20 generates a rectangular wave pulse from the voltage-dropped signal. Here, the mono-stable multivibrator 20 determines the voltage level of the rectangular wave pulse that is generated based on the Zener diode (ZD) which is connected in parallel with the drop resistor R1. The mono-stable multivibrator 20 determines a tilt, that is a pulse width of the rectangular wave pulse, that represents the voltage drop based on the time constant of the capacitor C which is connected in series with the drop resistor R1 and a resistor R2 which is connected in parallel with the capacitor C. Thus, the output wave of the mono-stable multivibrator 20 is shown as waveform "A" of FIG. 7. The waveform "A" of FIG. 7 is the same as the waveform of the test signal shown as waveform "A" of FIG. 2 that generates an arc. The waveform "A" of FIG. 7 shows the output waveform of the mono-stable multivibrator 20 and is input to an arc detection filter end of an arc fault circuit interrupter (AFCI) to test the action of the arc fault circuit interrupter (AFCI).

Figure 4:
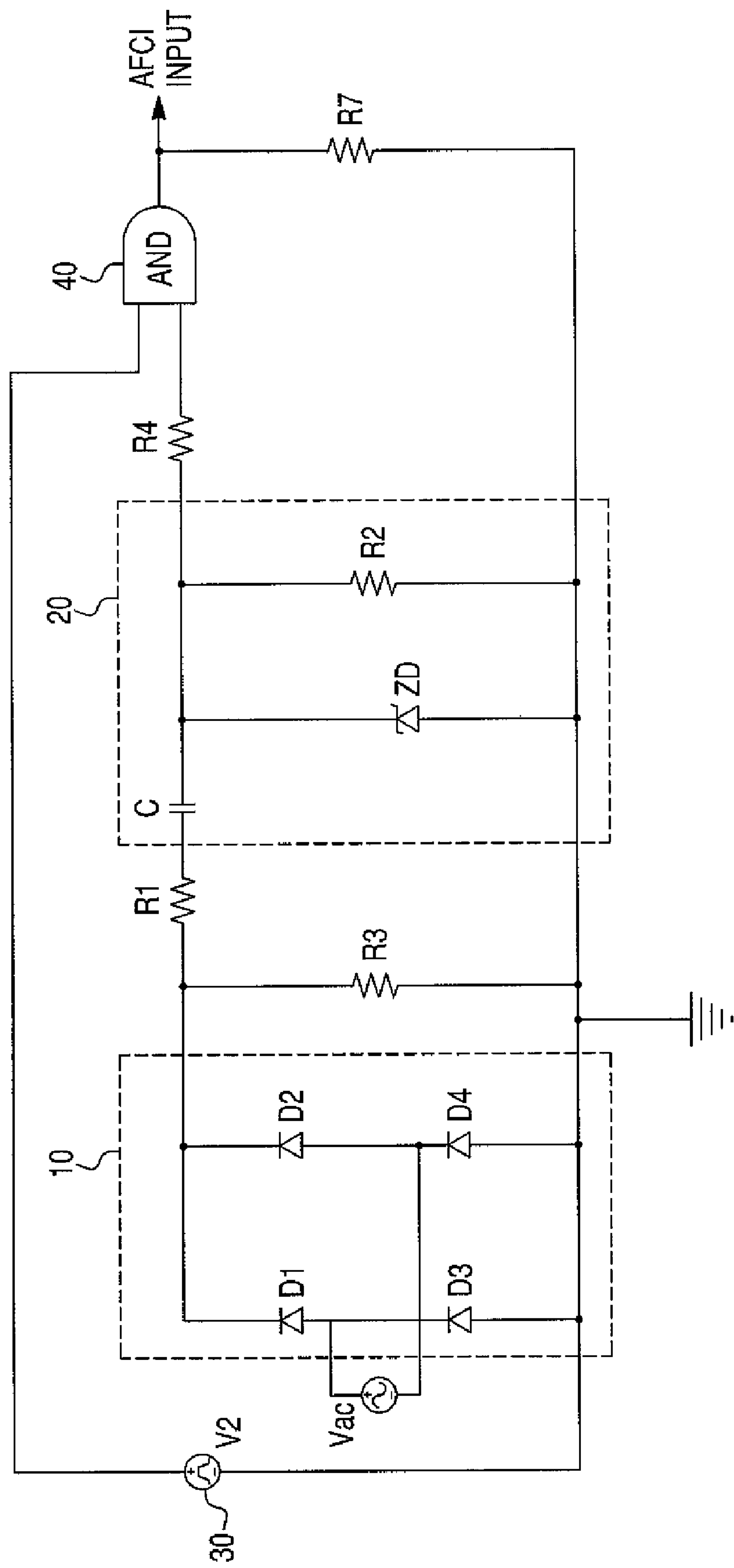
FIG. 4 is a circuit diagram of an arc wave generator for testing an arc fault circuit interrupter (AFCI) according to another exemplary embodiment of the present invention.

FIG. 4 is a circuit diagram illustrating an arc wave generator for testing an arc fault circuit interrupter (AFCI) according to another exemplary embodiment of the present invention. The arc wave generator shown in FIG. 4 is configured similarly to the arc wave generator shown in FIG. 3. Here, the arc wave generator shown in FIG. 3 further includes a high-frequency generator 30, and a logical multiplication device, that is an AND gate 40, which multiplies the high-frequency signal generated by the high-frequency generator 30 together with the rectangular wave signal generated by the mono-stable multivibrator 20 to generate an arc pulse which generates a false arc pulse. Here, in FIG. 4, the same reference numerals as those of FIG. 3 are assigned for the same elements as those of FIG. 3.

Figure 5:
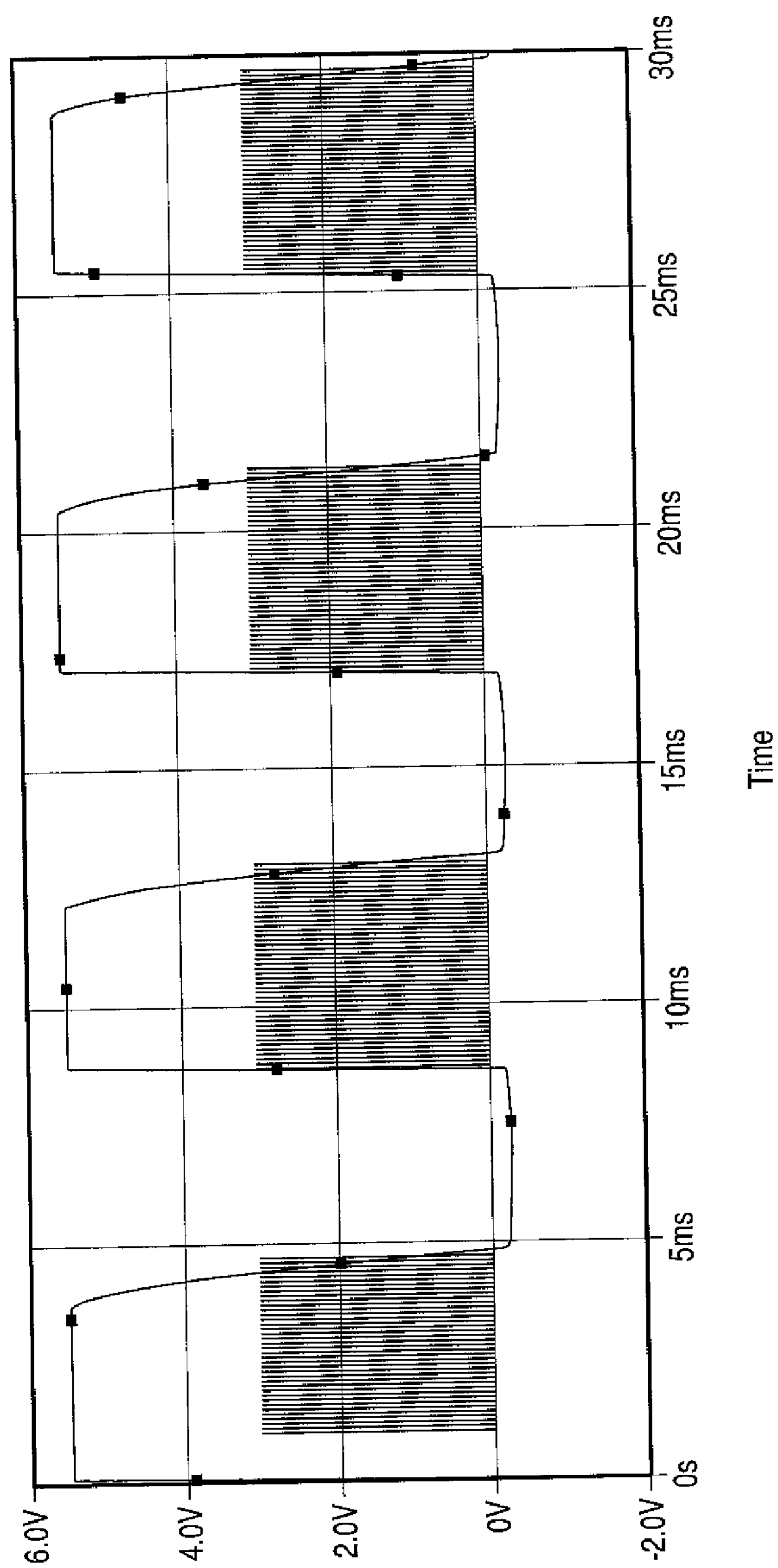
FIG. 5 is a waveform diagram of a final output of the arc wave generator of FIG. 4.

In FIG. 4, the rectifier 10 receives a commercial power source of 120V or 210V as an input and rectifies alternating-current voltage Vac of the commercial power source. Since the alternating-current voltage Vac of the commercial power source is a sinusoidal wave, the rectified wave in the rectifier 10 becomes a half-wave pulse which repeats with a phase interval of 180 degrees. Here, the rectifier 10 is designed as a bridge circuit where four diodes D1, D2, D3 and D4 are connected in the form of a bridge. The half-wave rectified signal from the rectifier 10 is voltage-dropped according to a resistance value of the drop resistor R1. The mono-stable multivibrator 20 generates a rectangular wave pulse from the voltage-dropped signal. The mono-stable multivibrator 20 determines the voltage level of the rectangular wave pulse that is generated based on the Zener diode (ZD) which is connected in parallel with the drop resistor R1. The mono-stable multivibrator 20 determines a tilt, that is a pulse width of the rectangular wave pulse, that represents the voltage drop based on the time constant of a capacitor C which is connected in series with the drop resistor R1 and a resistor R2 which is connected in parallel with the capacitor C. Resistors R3 and R4 are load resistors, respectively. The high-frequency generator 30 generates the pulse having a voltage value of 5V and high-frequency value of 1~9 MHz. The logical multiplication device, that is the AND gate 40, multiplies the high-frequency signal generated by the high-frequency generator 30 by the rectangular wave signal generated by the mono-stable multivibrator 20 to generate an arc pulse, that is a false arc pulse. The output waveform of the AND gate 40 is the same as that shown in FIG. 5. The output wave (the waveform of FIG. 5) of the AND gate 40 is input to an arc detection filter of an arc fault circuit interrupter (AFCI) to test the action of the arc fault circuit interrupter (AFCI).

Figure 6:
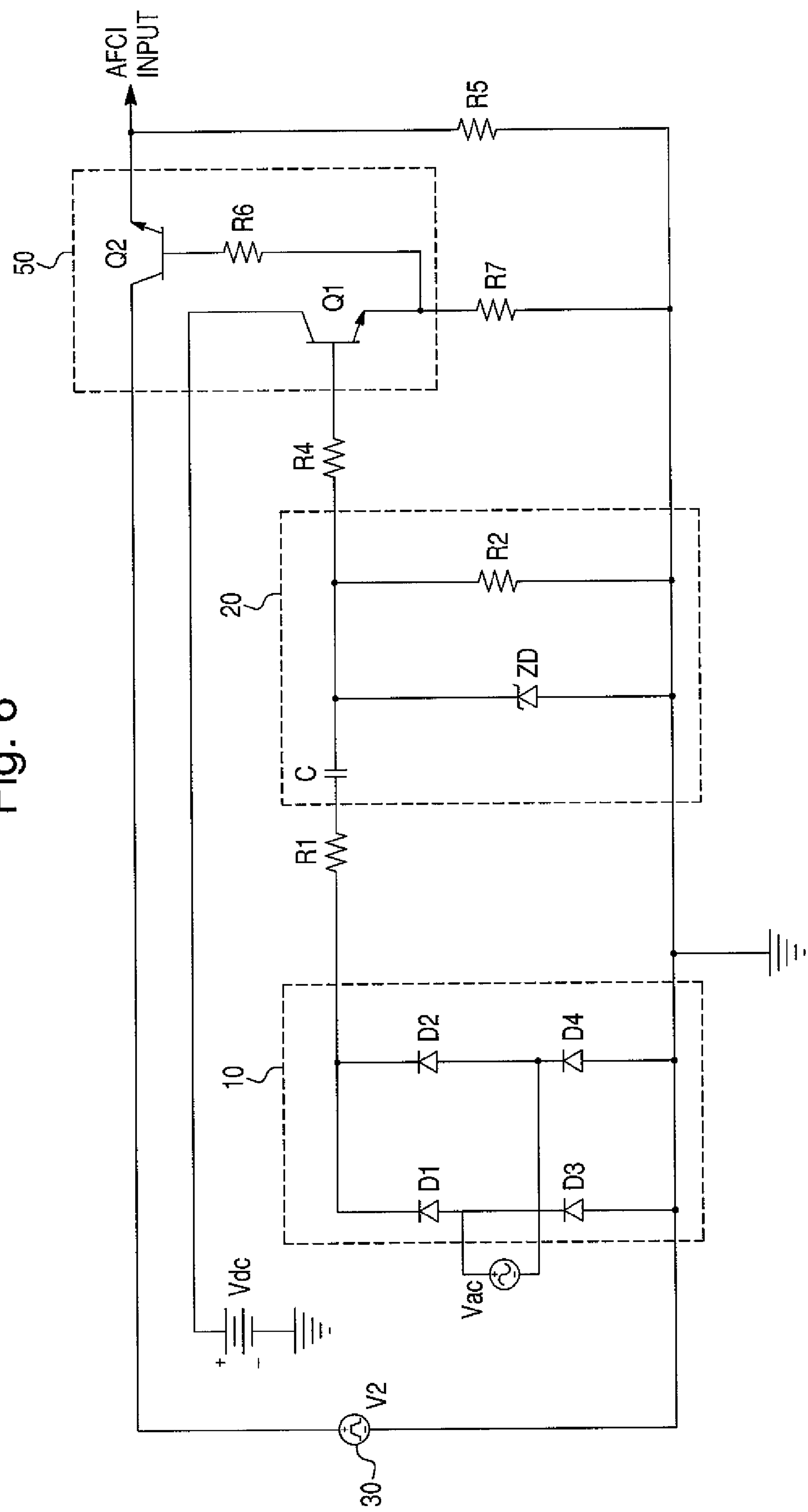
FIG. 6 is a circuit diagram of an arc wave generator for testing an arc fault circuit interrupter (AFCI) according to yet another exemplary embodiment of the present invention.

FIG. 6 is a circuit diagram showing an arc wave generator for testing an arc fault circuit interrupter (AFCI) according to yet another exemplary embodiment of the present invention. The arc wave generator of in FIG. 6 is configured similarly to the arc wave generator shown in FIG. 4. Here, instead of including the AND gate 40, the arc wave generator shown in FIG. 6 further includes a switching unit 50 which includes a first transistor Q1 which is turned "ON/OFF" according to the rectangular wave that is generated by the mono-stable multivibrator 20, and a second transistor Q2 which is operated in connection with the first transistor Q1 and performs a switching operation with respect to a high-frequency signal that is generated from the high-frequency generator 30. Here, in FIG. 6, the same reference numerals as those of FIG. 4 are assigned for the same elements as those of FIG. 4.

In FIG. 6, the rectifier 10 receives a commercial power source of 120V or 210V as an input and rectifies alternating-current voltage Vac of the commercial power source. Since the alternating-current voltage Vac of the commercial power source is a sinusoidal wave, the rectified wave in the rectifier 10 becomes a half-wave pulse which repeats with a phase interval of 180 degrees. The rectifier 10 is designed as a bridge circuit where four diodes D1, D2, D3 and D4 are connected preferably in the form of a bridge. The half-wave rectified signal from the rectifier 10 is voltage-dropped according to a resistance value of the drop resistor R1. The mono-stable multivibrator 20 generates a rectangular wave pulse from the voltage-dropped signal. Here, the mono-stable multivibrator 20 determines a voltage level of the rectangular pulse wave that is generated based on the Zener diode (ZD) which is connected in parallel with the drop resistor R1. The mono-stable multivibrator 20determines a tilt, that is a pulse width of the rectangular pulse wave, that represents the voltage drop based on a time constant of a capacitor C which is connected in series with the drop resistor R1 and a resistor R2 which is connected in parallel with the capacitor C. Thus, the output wave of the mono-stable multivibrator 20 is shown as waveform "A" of FIG. 7. The output wave of the mono-stable multivibrator 20 (the waveform "A" of FIG. 7) is applied to the base of the first transistor Q1 of the switching unit 50 through the resistor R4. In addition, the direct-current voltage Vdc of 5V is applied to the collector of the first transistor Q1. Thus, the first transistor Q1 is turned "ON/OFF" according to the output wave from the mono-stable multivibrator 20 (that is, the output waveform "A" of FIG. 7). Accordingly, the direct-current voltage Vdc of 5V which is applied to the collector of the first transistor Q1 is output through the emitter of the first transistor Q1. Meanwhile, the high-frequency generator 30 generates the pulse having a voltage value of 5V and high-frequency value of 1~9 MHz.

The high-frequency signal that is generated from the high-frequency generator 30 is applied to the collector of the second transistor Q2 in the switching unit 50. The base of the second transistor Q2 is connected with the emitter of the first transistor Q1 through the resistor R6, and thus the second transistor Q2 is turned "ON/OFF" in linkage with the "ON/OFF" actions of the first transistor Q1. The second transistor Q2 is turned on as the first transistor Q1 has been turned on. Thus, the high-frequency signal generated by the high-frequency generator 30 which is connected with the collector of the second transistor Q2 is output through the emitter of the second transistor Q2. Here, the output waveform which is output through the second transistor Q2 of the switching unit 50 is the same as the waveform "B" of FIG. 7. The output wave (the waveform "B" of FIG. 7) of the switching unit 50 is input to an arc detection filter end of an arc fault circuit interrupter (AFCI) to test the action of the arc fault circuit interrupter (AFCI).

In the above-described embodiments, the arc pulses generating the false arc are substantially the same as the waveform "A" of FIG. 2, and thus the arc shown in the waveform "B" of FIG. 2 is generated.

It should be understood that the arc wave generator of the embodiments described above may be implemented separately from the arc fault circuit interrupter (AFCI) or it may be built into the AFCI such that the AFCI may have a built-in test capability. In this case, the AFCI includes the arc wave generator for generating a false arc or a false arc pulse, an arc detection unit or an arc detection filter, and an electronic circuit interrupter for interrupting operation of a circuit when the false arc is detected by the arc detection unit.

As stated above, the arc wave generator for testing an arc fault circuit interrupter (AFCI) can generate an arc pulse that generates a false arc which closely approximates an actual arc for testing. The arc wave generator may have a simple circuit configuration and may be simply manufactured for adjusting a pulse width and a pulse level to easily make a test system.

As described above, the present invention has been described with respect to various embodiments. However, the present invention is not limited to the above embodiments, and it is possible for one who has an ordinary skill in the art to make various modifications and variations, without departing off the spirit of the present invention. Thus, the protective scope of the present invention is not defined within the detailed description thereof but is defined by the claims to be described later and the technical spirit of the present invention.

What is claimed is:

1. An arc wave generator for use in a test system for testing whether or not an arc fault circuit interrupter (AFCI) is operating normally, the arc wave generator comprising:

a rectifier which rectifies alternating-current voltage of a commercial power source to generate a rectified signal;

a drop resistor which drops voltage of the rectified signal to generate a voltage-dropped signal; and a mono-stable multivibrator which adjusts a voltage level and a pulse width of the voltage-dropped signal and generates a pulse signal used to provide a false arc for testing the arc fault circuit interrupter (AFCI).

2. The arc wave generator according to claim 1, wherein the rectifier comprises diodes which are connected in the form of a bridge for rectifying the alternating-current voltage of the commercial power source to generate a half-wave form.

3. The arc wave generator according to claim 1, wherein the mono-stable multivibrator comprises:

a Zener diode connected in parallel with the drop resistor for determining a voltage level of the voltage-dropped signal, and a resistor and a capacitor for determining a tilt representing a voltage drop based on a time constant for changing a pulse width.

4. The arc wave generator according to claim 1, further comprising:

a high-frequency generator for generating a high-frequency signal; and an AND gate which performs a logical multiplication operation to multiply the high-frequency signal generated by the high-frequency generator by the pulse signal generated by the mono-stable multivibrator to generate a multiplied pulse signal used to generate a false arc pulse for testing the arc fault circuit interrupter (AFCI).

5. The arc wave generator according to claim 1, further comprising:

a high-frequency generator for generating a high-frequency signal; and a switching unit which performs a switching operation with respect to the high-frequency signal that is generated by the high-frequency generator according to the pulse signal output from the mono-stable multivibrator to generate a switched pulse signal used to generate a false arc pulse for testing the arc fault circuit interrupter (AFCI).

6. The arc wave generator according to claim 5, wherein the switching unit comprises:

a first transistor having a collector, an emitter, and a base, said first transistor being turned "ON/OFF" according to the pulse signal output by the mono-stable multivibrator into said base of said first transistor, and outputting a direct-current voltage that is applied to the collector of the first transistor via the emitter thereof; and a second transistor having a collector, an emitter, and a base, said base being connected with the emitter of the first transistor through a resistor, said collector being connected to the high-frequency generator, and said second transistor being operated in linkage with the "ON/OFF" operations of the first transistor such that the second transistor is turned on as the first transistor is turned on thereby outputting the high-frequency signal which is generated by the high-frequency generator and applied to the collector of the second transistor via the emitter of the second transistor.

7. An arc fault circuit interrupter having circuitry for detecting an arcing condition and for interrupting operation of a circuit when the arcing condition is detected, said arc fault circuit interrupter comprising:

a testing circuit for generating a false arcing condition, said testing circuit including a sinusoidal wave processing unit for receiving a sinusoidal AC power signal and processing said power signal to approximate a predetermined arc wave form, a square wave generator for generating a square wave of a predetermined frequency, and a multiplication unit for multiplying the square wave by the processed power signal to produce a false arc pulse.

8. The arc fault circuit interrupter according to claim 7, wherein the multiplication unit comprises a switching unit or an AND gate that produces a logic high output when the square wave and the processed power signal is logic high.

9. The arc fault circuit interrupter according to claim 7, wherein the sinusoidal wave processing unit comprises a rectifier for rectifying the AC power signal into a half wave pulse signal, a Zener diode for adjusting a level of the half wave pulse signal, and at least one capacitor and resistor for adjusting a width of the half wave pulse signal in accordance with a time constant determined by the at least one capacitor and resistor.

10. The arc fault circuit interrupter according to claim 7, wherein the AC power signal has a frequency that is substantially less than the predetermined frequency of the square wave.

11. The arc fault circuit interrupter according to claim 7, wherein the multiplication unit comprises:

a first transistor turned ON and OFF based on the processed power signal output; and a second transistor connected to the first transistor such that said second transistor is turned ON and OFF when the first transistor is turned ON and OFF, respectively, said second transistor outputting said square wave when said second transistor is ON.

12. The arc fault circuit interrupter according to claim 7, wherein said sinusoidal wave processing unit comprises a rectifier connected in series with a mono-stable multi-vibrator.

13. The arc fault circuit interrupter according to claim 12, wherein said rectifier comprises a bridge-type rectifier including a plurality of diodes.

14. A method of generating an arc wave for use in a test system for testing whether or not an arc fault circuit interrupter (AFCI) is operating normally, the method comprising the steps of:

receiving an alternating-current voltage;

rectifying the alternating current voltage to form a half-wave signal having a plurality of pulses;

adjusting a voltage level and a pulse width of the pulses of the half-wave signal; and generating a false arc signal based on the adjusted half-wave signal and providing the false arc signal to the AFCI for testing.

15. The method according to claim 14, wherein the step of adjusting the voltage level comprises reducing the voltage of the half-wave signal using a voltage drop resistor, adjusting the voltage level of the half-wave signal using a Zener diode, and adjusting a pulse width of the pulses of the half-wave signal using an RC circuit.

16. The method according to claim 14, further comprising:

generating a high frequency signal;

ANDing the high frequency signal with the adjusted half-wave signal to perform a logical multiplication to generate a false arc pulse for testing the AFCI.

17. The method according to claim 14, further comprising:

generating a high-frequency signal; and switching the high frequency signal as an output false arc pulse when the half wave signal is above a predetermined voltage using at least one transistor.

* * * * *